United States Patent
Hopper et al.

(10) Patent No.: US 7,070,911 B1
(45) Date of Patent: Jul. 4, 2006

(54) STRUCTURE AND METHOD FOR REDUCING STANDING WAVES IN A PHOTORESIST

(75) Inventors: Dawn Hopper, Santa Clara, CA (US); Kouros Ghandehari, Santa Clara, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 180 days.

(21) Appl. No.: 10/350,472

(22) Filed: Jan. 23, 2003

(51) Int. Cl.
*G03F 7/00* (2006.01)

(52) U.S. Cl. .................. 430/313; 430/14; 430/311; 430/317; 430/950

(58) Field of Classification Search ............... 430/14, 430/311, 313, 317, 950
See application file for complete search history.

(56) References Cited

U.S. PATENT DOCUMENTS

| | | | | |
|---|---|---|---|---|
| 5,741,626 A | * | 4/1998 | Jain et al. | 430/314 |
| 6,331,379 B1 | * | 12/2001 | Ireland et al. | 430/314 |
| 6,562,544 B1 | * | 5/2003 | Cheung et al. | 430/313 |
| 6,599,838 B1 | * | 7/2003 | Shih et al. | 438/692 |
| 6,853,043 B1 | * | 2/2005 | Yeh et al. | 257/437 |

* cited by examiner

*Primary Examiner*—Nicole Barreca

(57) ABSTRACT

A structure and method for reducing standing waves in a photoresist during manufacturing of a semiconductor is presented. Embodiments of the present invention include a method for reducing standing wave formation in a photoresist during manufacturing a semiconductor device comprising depositing a first anti-reflective coating having an extinction coefficient above a material, and depositing a second anti-reflective coating having an extinction coefficient above the first anti-reflective coating, such that the first anti-reflective coating and the second anti-reflective coating reduce the formation of standing waves in a photoresist during a lithography process.

18 Claims, 15 Drawing Sheets

169B

STRUCTURE AND METHOD FOR REDUCING STANDING WAVES IN A PHOTORESIST

FIELD OF THE INVENTION

The present invention relates to the field of semiconductor manufacturing. More specifically, embodiments of the present invention relate to a structure and method for using a multi-layer anti-reflective coating for reducing standing waves in a photoresist.

BACKGROUND OF THE INVENTION

Moore's Law states that the number of semiconductor devices, (e.g., transistors), per unit area will double every 18–24 months. While other factors such as design improvements contribute to the rapid growth, one of the fundamental drivers of this inexorable density increase is the ever-shrinking minimum feature size of semiconductors. For example, a common minimum feature size of modern semiconductors is 0.15 microns.

A modern integrated circuit, IC, for example a flash memory device, may have millions to hundreds of millions of devices made up of complex, multi-layered structures that are fabricated through hundreds of processing steps. Those structures, for example a gate stack, are formed by repeated deposition and patterning of thin films on a silicon substrate, also known as a wafer.

For example, a structure above the surface of a wafer may be formed by depositing polysilicon over the entire wafer, followed by the application of a photosensitive polymer layer, known as photoresist. The photoresist-covered wafer is exposed to a light source, usually a narrow band of ultraviolet light, for example, from a mercury lamp. A mask is used to shield portions of the wafer from the light, creating an exposure pattern on the wafer. The light energy changes the chemical nature of the photoresist. A developing solution is then used to remove the photoresist in the areas exposed to the light source. This sequence of steps is known as photolithography.

The pattern of remaining photoresist (which was the mask pattern) is then recreated in the underlying film (e.g., the layer of polysilicon) by etching away the material that is not protected by photoresist. In a subsequent processing step, the photoresist is chemically removed.

Prior Art FIGS. 1A through 1D illustrate a conventional photolithography process used to form a gate stack of a floating gate memory cell 10. In Prior Art FIG. 1A, oxide layer 112 has been formed by conventional means over wafer 110. A layer of photoresist 120 is then deposited above the oxide layer.

In Prior Art FIG. 1B, light energy 140 is directed at photoresist layer 120. A mask structure 130 blocks some areas of photoresist layer 120 from receiving light energy 140.

In Prior Art FIG. 1C, the photoresist has been developed. Areas of photoresist that received (were exposed to) the light energy 140 are removed by the developing process. During the exposure process, reflected light causes standing waves 169a to form on the edges of the photoresist resulting in uneven side-walls of the photoresist. Wafer 110 subsequently undergoes an etching process. As described previously, an etching process removes material where photoresist material is not present.

As depicted in Prior Art FIG. 1D, after etching, and a subsequent removal of the remaining photoresist material, substantial portions of memory cell 10 are formed. As a result of standing waves 169a in the photoresist, the resulting memory gate cell 10 has a contoured sidewall 169b. Contoured or non-linear sidewalls of a photoresist decrease the accuracy of the subsequent etching processes thus reducing the accuracy of the final dimensions of the channel length. As stated above, Moore's Law predicts the number of components per a unit area to double every 18–24 months. To maintain steady reduction in feature size of modern semiconductors, manufacturing processing must be more accurate than ever. The formation of standing waves in photoresist prevents semiconductor manufacturing to achieve adequate accuracy when producing channel lengths smaller than 0.015 microns.

The gate length, generally corresponding approximately with minimum feature size 18, is one of the most critical features of a Metal Oxide Semiconductor, MOS, device. When a field-effect transistor in a MOS device is in the "on" state, it conducts current between a drain and a source. The shorter the distance between a drain and a source, the shorter the distance that charge carriers, e.g., electrons or "holes," must travel. In general, charge carriers travel at a constant speed in a uniform material. (Speed may vary according to differing types of material and different types of charge carriers.) Therefore, a short channel produces a faster or higher speed transistor. Up to a certain point, which generally varies from design to design, shorter channels corresponding to faster transistors, are considered desirable. However, if a channel becomes too short, the device may suffer from what is known as the "short channel effect."

As channel length grows shorter, threshold voltage, the voltage required to turn on a transistor, begins to decrease and leakage current increases. These effects are commonly referred to in the semiconductor arts as the "short channel effect." An increase in leakage current is particularly onerous in flash memory devices as flash has found wide acceptance in very low power applications, for example mobile phones, due to the ability of flash to retain information without applied power. Increases in leakage current may have a significant deleterious effect on total power consumption of the flash device and the product using the flash device.

A problem with the photolithography process results from the highly reflective nature of the materials and surfaces of semiconductor devices. Prior Art FIG. 2A illustrates a deleterious effect of reflective surfaces upon photolithography. As a result of reflections from surface 110, standing waves caused the photoresist 120 to cure unevenly thus forming contoured sidewalls.

Unfortunately, standing wave 169a produces widely varying levels of light energy intensity within photoresist layer 120. In general, the light energy intensity within photoresist layer 120 will vary from zero to twice the level of the incident radiation. In regions of photoresist layer 120 receiving zero light energy, the desirable chemical changes in the polymer(s) comprising photoresist layer 120 do not occur. In regions of photoresist layer 120 receiving more light energy than is incident, damage may occur. In other regions, varying levels of chemical changes may occur corresponding to the varying levels of light energy received. As an unfortunate consequence, the photoresist material is not changed uniformly. After developing, portions of photoresist may remain in regions intended to be removed, resulting in incorrectly formed semiconductor structures as illustrated in Prior Art FIG. 2B. For example, a gate length 18 may be unintentionally increased because of incomplete etching resulting from such standing waves.

Prior Art FIG. 3 illustrates one well-known solution to the problem of standing waves. Layer 220 is applied over reflective surface 210 prior to the application of photoresist layer 120. Through careful control of the optical properties and thickness of layer 220, reflections from reflective surface 210 can be eliminated prior to having a deleterious effect within photoresist layer 120. Layer 220, applied at the bottom of photoresist layer 120 is known as a Bottom Anti-Reflective Coating, or BARC. A conventional BARC is typically a silicon oxynitride, $SiN_xO_y$, and is deposited by chemical vapor deposition (CVD).

Unfortunately, the thickness of a bottom anti-reflective coating is critical to its function. For example, to perfectly cancel reflected light with incident light (along the normal to the surfaces), a BARC should have an effective optical thickness of one quarter of a wavelength ($\lambda/4$). The wavelength of light used to expose the photoresist will typically determine the minimum feature size of the semiconductor device as determined by the Rayleigh criteria. Consequently, ever-smaller wavelengths of light energy are being employed forever-smaller minimum feature dimensions. As the wavelengths decrease, the $\lambda/4$ thickness of the BARC decreases and the allowable variation of BARC thickness to achieve a desirable percentage decrease in reflected energy also decreases. As an unfortunate consequence, it is becoming commercially infeasible to apply BARCs with the required thickness tolerances.

Reflectivity at an interface (normal incidence) is given by the relation:

$$R = \left|\frac{\tilde{n}_1 - \tilde{n}_2}{\tilde{n}_1 + \tilde{n}_2}\right|^2 \quad \text{(relation 1)}$$

Where n is the refractive index (real) of a material and k is the coefficient of extinction (complex) of a material. By definition, $\tilde{n}_1 = n_1 + ik_1$ is the complex index of refraction for material 1, where n is the refractive index (real) of a material and k is the coefficient of extinction (complex) of a material. In this example, material 1 ($\tilde{n}_1$) has a non-zero complex portion. Consequently, if material 2 has a purely real index of refraction, then the modulus of $\tilde{n}_1 - \tilde{n}_2$ can never be identically zero, and the reflectivity can not be zero. Consequently, an anti-reflective coating, typically with a complex index of refraction, can not completely cancel reflections from a reflective material with a real index of refraction, for example a dielectric or damascene metal.

If an ARC was made thick enough, standing waves in the photoresist could be substantially reduced. Consequently, a very thick ARC creates more problematic issues than the standing waves in the photoresist such as hills and valleys. In addition, a thick ARC is very difficult to remove and can cause contamination of the semiconductor device.

Semiconductor processing equipment is extremely expensive. Fundamental semiconductor processing steps, e.g., implantation, diffusion and etching, typically require long periods of development and extensive qualification testing. Implementing a new fabrication process requires considerable resources on the part of the semiconductor manufacturer. A manufacturer may have to alter or entirely revamp process libraries and process flows in order to implement a new fabrication process. Additionally, re-tooling a fabrication line is very expensive, both in terms of direct expenses as well as in terms of opportunity cost due to the time required to perform the re-tooling. Consequently, any solution to standing waves within photoresist should be compatible with existing semiconductor processes and equipment without the need for revamping well established tools and techniques.

SUMMARY OF THE INVENTION

Accordingly, what is needed is a structure and method for reducing standing waves in photoresist during manufacturing of a semiconductor device. The structure and method for reducing standing waves in a photoresist should utilize established semiconductor manufacturing equipment. In addition, the structure and method for reducing standing waves in a photoresist should facilitate in maintaining precise critical dimensions for small-scale semiconductor manufacturing.

A structure and method for reducing standing waves in a photoresist during manufacturing of a semiconductor is presented. Embodiments of the present invention include a method for reducing standing wave formation in a photoresist during manufacturing a semiconductor device comprising depositing a first anti-reflective coating having an extinction coefficient above a material, and depositing a second anti-reflective coating having an extinction coefficient above the first anti-reflective coating, such that the first anti-reflective coating and the second anti-reflective coating reduce the formation of standing waves in a photoresist during a lithography process.

Furthermore, an additional embodiment of the present invention includes a structure used in a photography step during manufacturing of a semiconductor for reducing the formation of standing waves in a photosensitive material comprising a first anti-reflective coating having an extinction coefficient deposited on a material, a second anti-reflective coating having an extinction coefficient deposited above the first anti-reflective coating, an oxide film deposited above the second anti-reflective coating, such that the first anti-reflective coating, the second anti-reflective coating, and the oxide film reduce the formation of standing waves in a photosensitive material during a lithography process.

These and other objects and advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art FIG. 1A through Prior Art FIG. 1D are illustrations of a conventional semiconductor manufacturing process that incurs problems with standing waves in a photoresist.

Prior Art

Prior Art

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, and components have not been described in detail as not to unnecessarily obscure aspects of the present invention.

A System and Method for Reducing Standing Waves in Photoresist

Figure 6A:
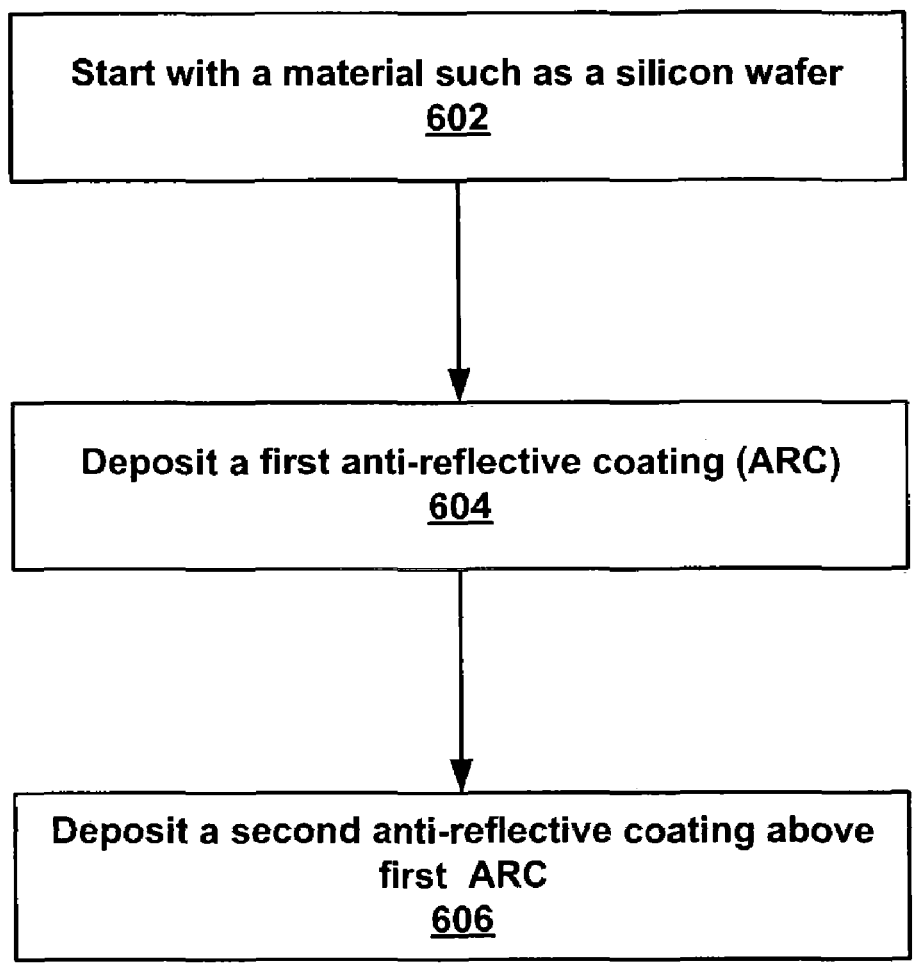
FIGS. 6A and 6B are flow diagrams illustrating an exemplary process of depositing multiple anti-reflective coatings on a material in accordance with an embodiment of the present invention.

FIGS. 4A–4H provide side sectional views of the structure created according to embodiments of the method of the present invention as set forth in the flow chart of FIG. 6A. For purposes of clarity, the following discussion will utilize the side sectional views of FIGS. 4A–4H in conjunction with the flow chart 600a of FIG. 6A to clearly describe the embodiments of the present invention. Flow chart 600a of FIG. 6A begins with step 602. At step 602, the present embodiment forms a wafer or substrate such as, for example, a silicon substrate.

Figure 1A:
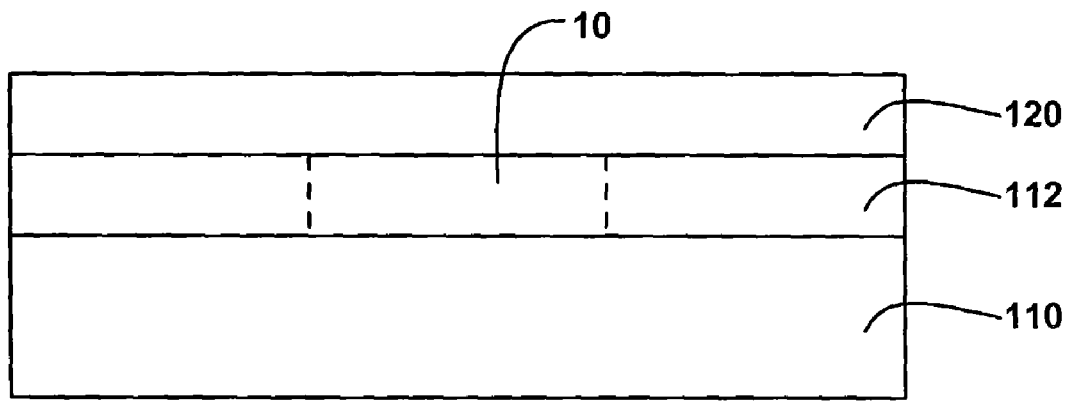
Figure 1B:
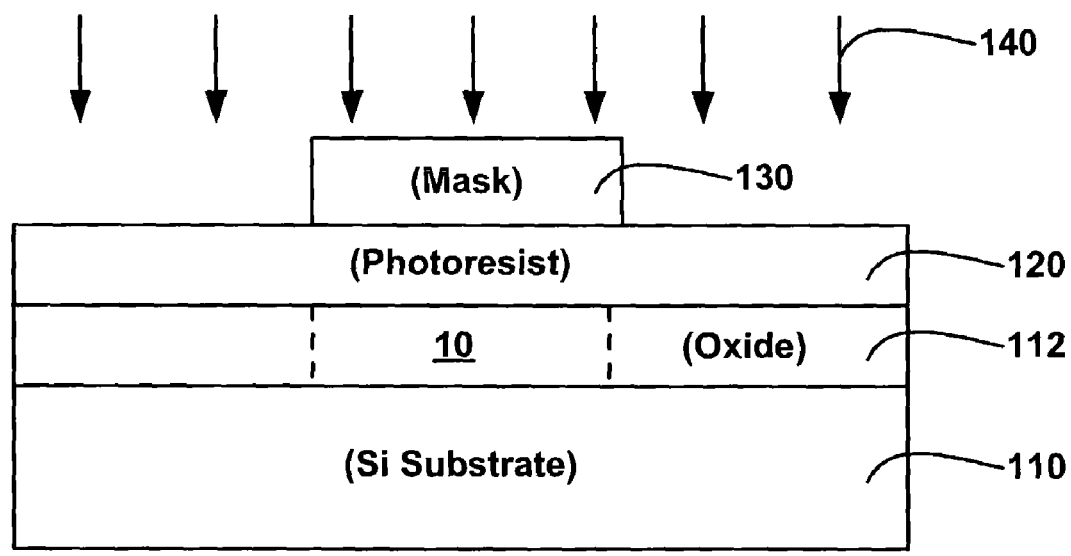
Figure 1C:
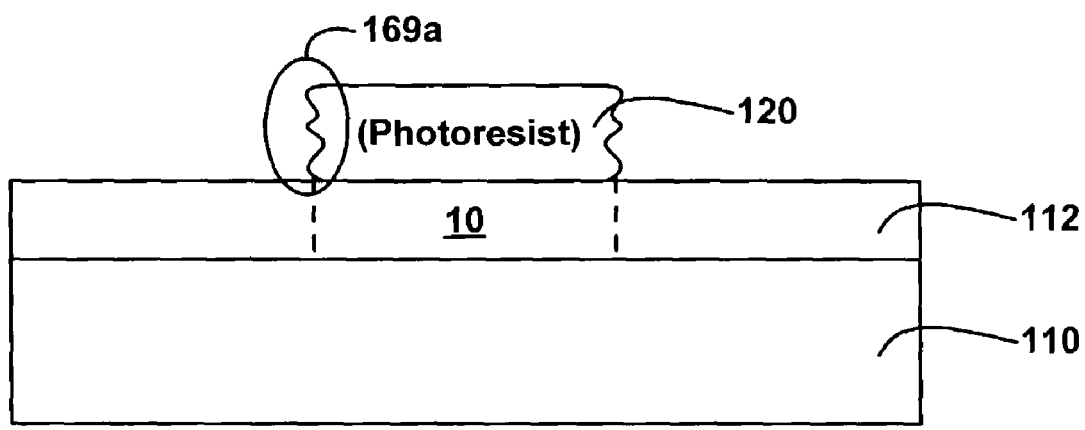
Figure 1D:
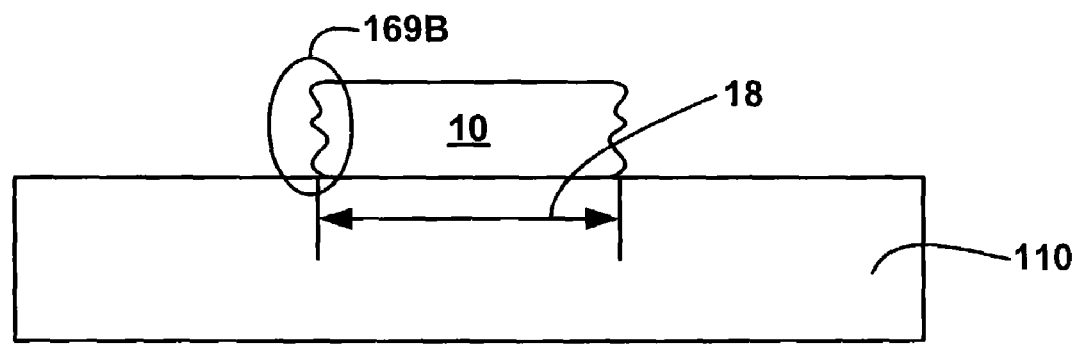
Figure 2A:
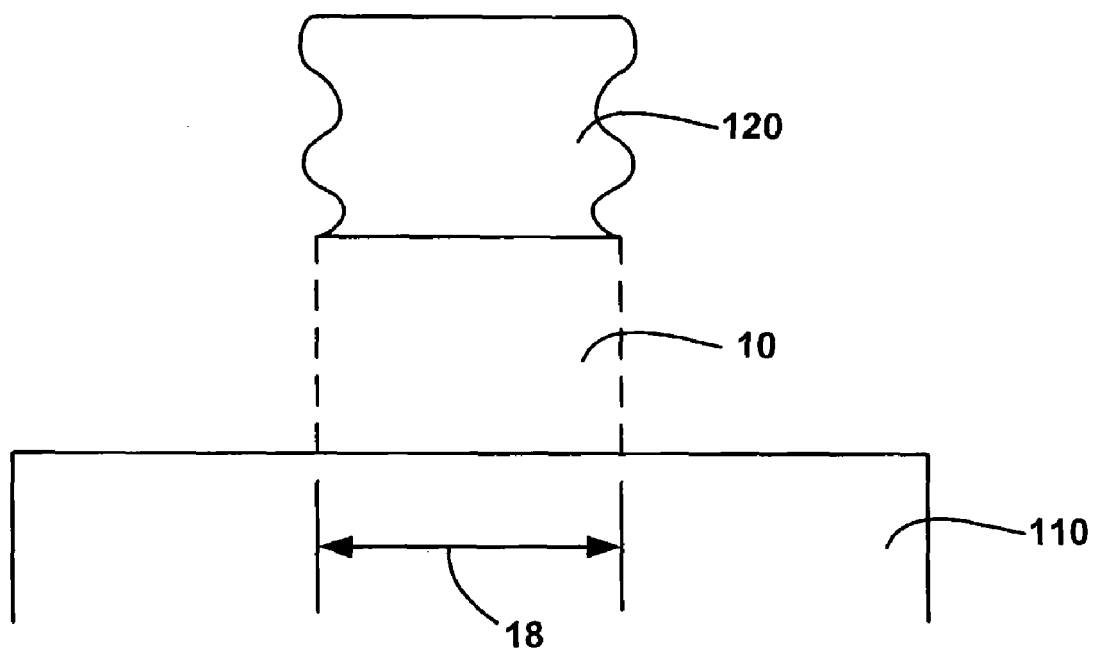
FIGS. 2A and 2B are illustrations of a conventional semiconductor manufacturing process that focuses on the formation of standing waves in a photoresist and conductive feature.
Figure 2B:
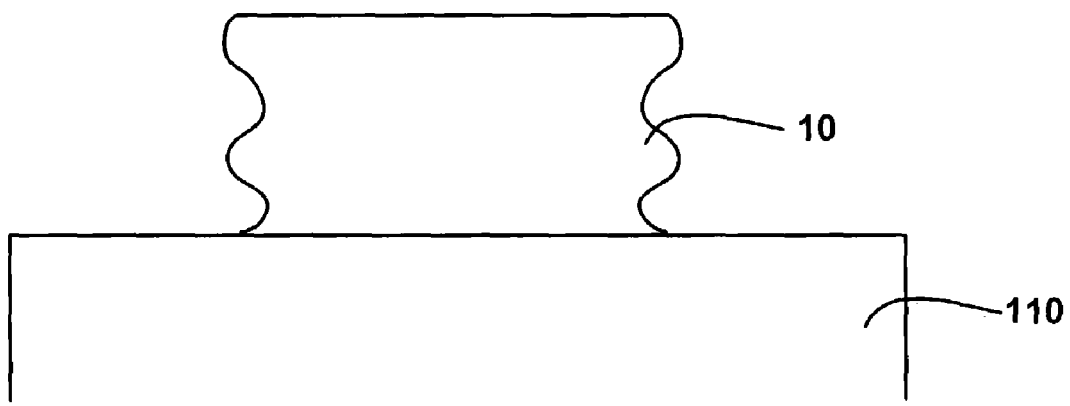
Figure 3:
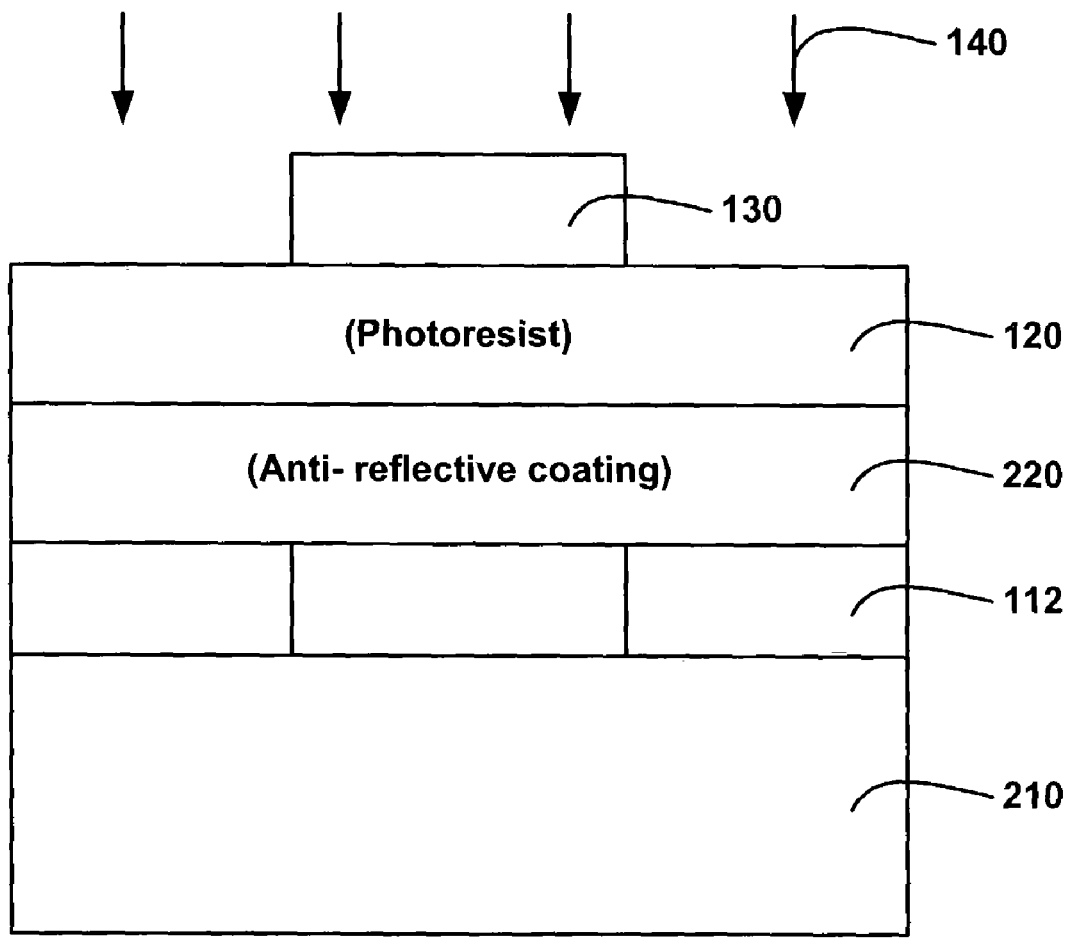
FIG. 3 is an illustration of a conventional system that uses an anti-reflective coating to reduce standing waves in a photoresist.
Figure 4A:
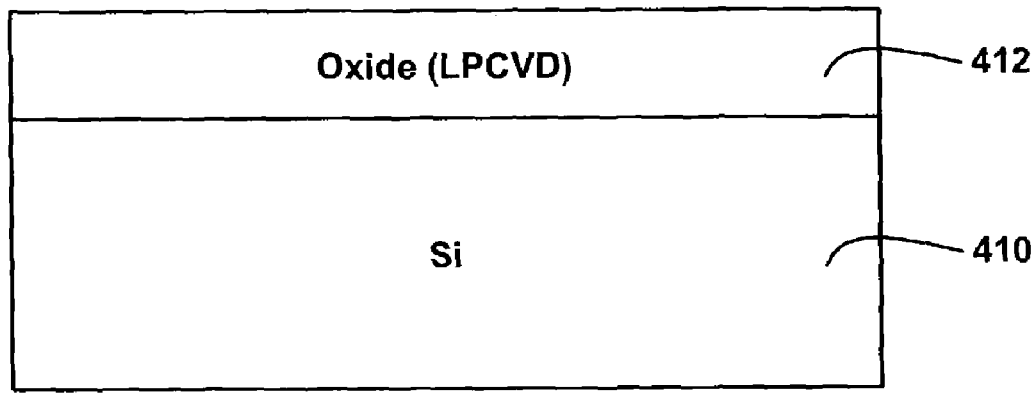
FIGS. 4A through 4H illustrate an exemplary semiconductor manufacturing process to reduce standing waves in a photoresist wherein a multi-layered anti-reflective coating is used in accordance with an embodiment of the present invention.

FIG. 4A is an illustration of an exemplary semiconductor manufacturing process to reduce standing waves in a photoresist wherein a multi-layered anti-reflective coating is used in accordance with an embodiment of the present invention. An oxide layer 412 is grown above wafer 410 by conventional means. Wafer 410 can be a silicon substrate or any other equivalent material suitable for the manufacturing of a semiconductor feature. Oxide layer 412 can be comprised of any combination of a tunnel oxide layer, an ONO stack or multiple polysilicon layers.

Figure 4B:
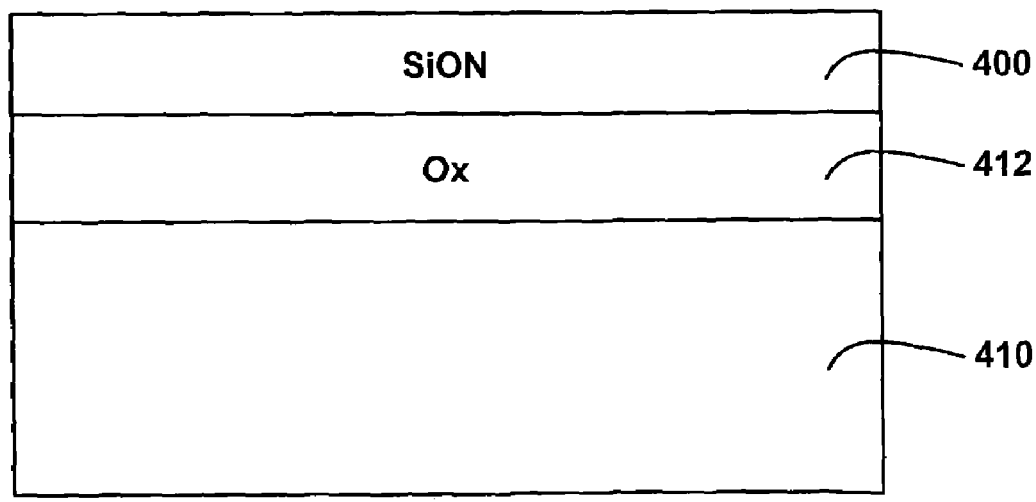

FIG. 4B illustrates the first layer of anti-reflective coating 400. Layer 400 is a conventional bottom anti-reflective coating, BARC. Layer 400 is typically inorganic, for example silicon oxynitride, and applied via chemical vapor deposition (CVD). Due to the deposition method, it is difficult to control both the optical characteristics and the thickness of layer 400. The variability of optical properties places great demands for precision in the layer thickness. Unfortunately, the thickness tolerance of layer 400, deposited by chemical vapor deposition processes, required to compensate for the optical variability of the material is typically not commercially feasible. In one embodiment of the present invention, ARC layer 400 is SiON, SiN, or SiC or any material that reduces reflections of light from wafer 410. Depositing ARC layer 400 corresponds to step 604 of FIG. 6A, a first antireflective coating is deposited above the starting material. In one embodiment of the present invention, a conductive oxide layer is deposited below the first anti-reflective coating. In one embodiment of the present invention, the conductive oxide layer is an oxide stack comprising multiple polysilicon and oxide layers.

An additional deleterious effect of conventional inorganic BARCs is known as "resist poisoning" or "footing." For some desirable conventional compositions of photoresist, residual nitrogen from the silicon oxynitride, for example BARC layer 400, contaminates the photoresist material. Such contamination may cause numerous ill effects, including, for example, blocking of light energy and/or difficulty in removing the contaminated resist material.

Figure 4C:
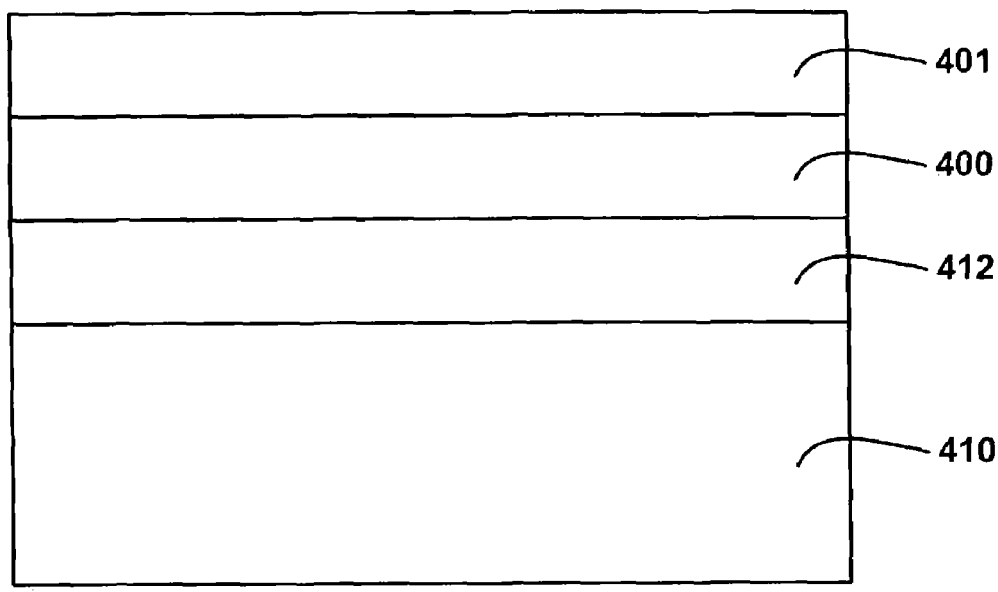

Layer 401 of FIG. 4C illustrates a novel second layer of anti-reflective material, according to an embodiment of the present invention. Typically, the ARC layers are deposited by chemical vapor deposition (CVD) or plasma enhanced chemical vapor deposition (PECVD). In one embodiment of the present invention, the first layer of ARC 400 has a higher extinction coefficient than the second layer of ARC 401. In another embodiment of the present invention, each ARC is plasma treated to null the effects of nitrogen poisoning, such as footing of the photoresist. Depositing the second ARC layer 401 corresponds to step 606 of FIG. 6A, to deposit a second ARC layer above the first ARC layer.

Figure 4D:
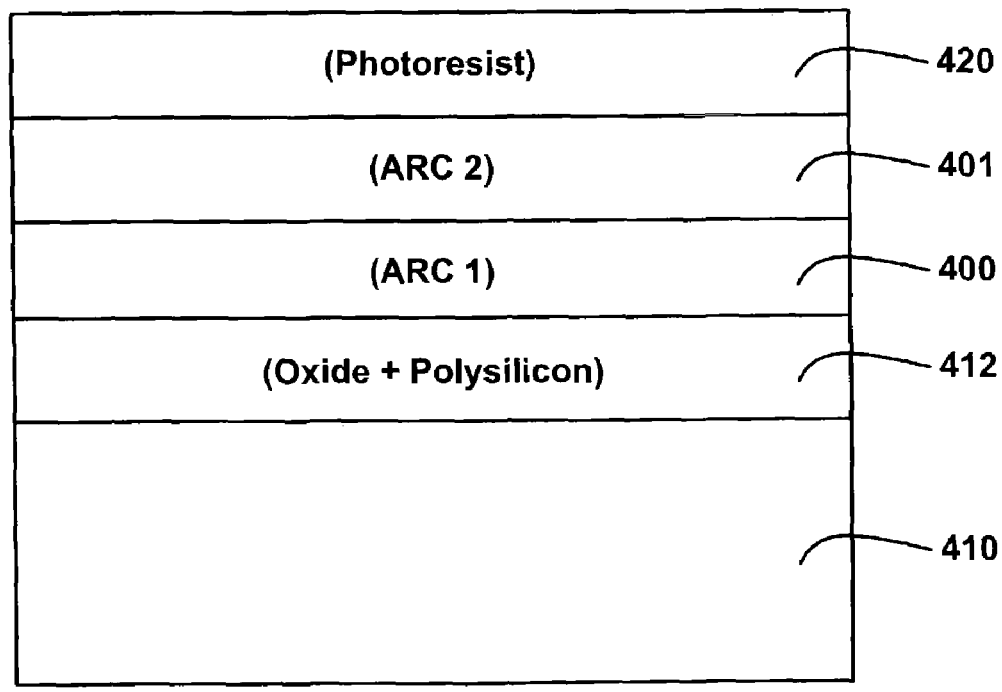

FIG. 4D illustrates the addition of a photoresist layer 420 above the multiple ARCs. In one embodiment of the present invention, the thickness of each ARC layer is between 25 and 600 angstroms. Photoresist layer 420 can be a positive-type photoresist or a negative-type photoresist. For positive resists, the resist is exposed with UV light wherever the underlying material is to be removed. In these resists, exposure to the UV light changes the chemical structure of the resist so that it becomes more soluble in the developer. The exposed resist is then washed away by the developer solution, leaving windows of the bare underlying material. The mask, therefore, contains an exact copy of the pattern which is to remain on the wafer. Negative resists behave in just the opposite manner. Exposure to the UV light causes the negative resist to become polymerized, and more difficult to dissolve. Therefore, the negative resist remains on the surface wherever it is exposed, and the developer solution removes only the unexposed portions. Masks used for negative photoresists, therefore, contain the inverse (or photographic "negative") of the pattern to be transferred. FIGS. 4A through 4H show the pattern generated from the use of negative resist.

As a beneficial consequence of the novel combination of an additional anti-reflective coating having a lower extinction coefficient over a first anti-reflective coating having a higher extinction coefficient, reflections may be advantageously reduced or eliminated over a wide range of thickness for an underlying layer. In addition, having multiple layers of an ARC allows the final thickness of the ARC layer to be substantially less than an equivalent single ARC layer, thus reducing the work required to remove the ARC layer in subsequent processing steps. Furthermore, plasma treatment of the ARC stack advantageously eliminates nitrogen poisoning of a photoresist that might otherwise have occurred if the photoresist was applied directly over an anti-reflective coating.

Figure 4E:
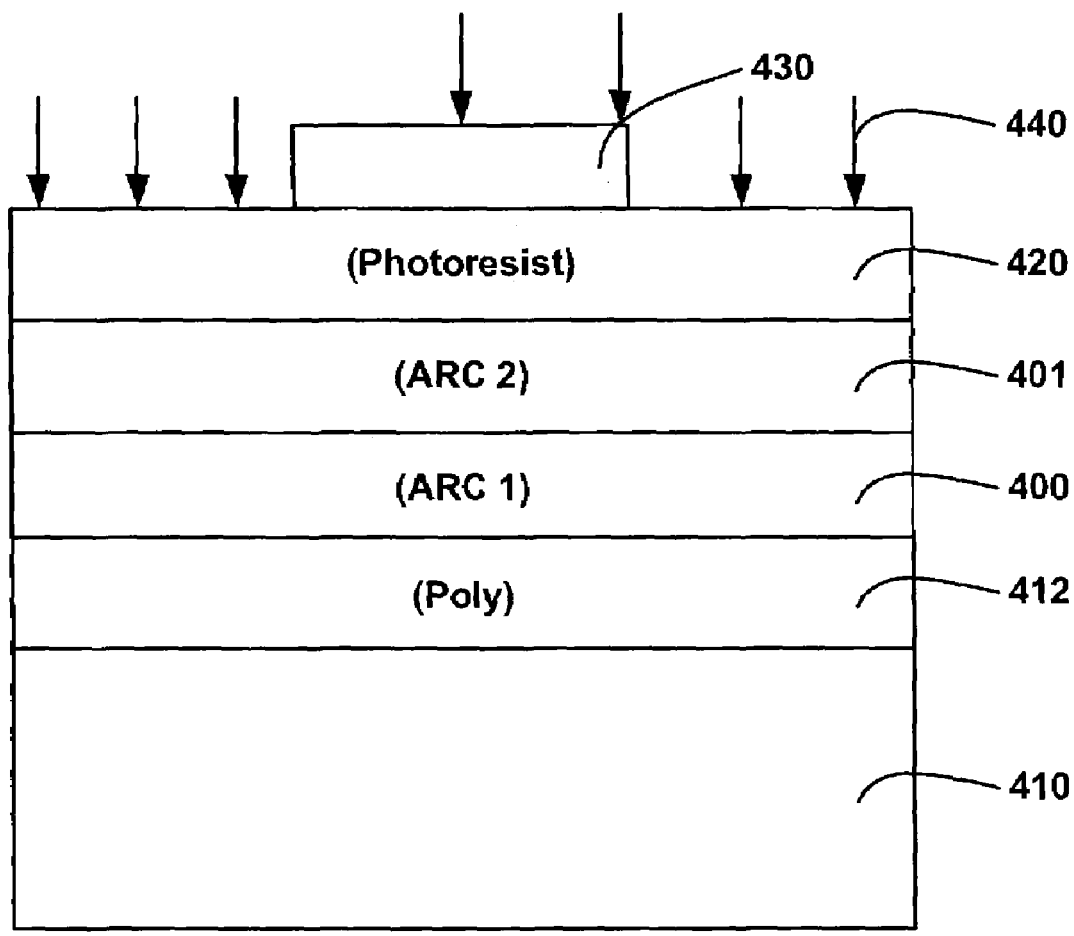

FIG. 4E illustrates the process of exposing a photoresist layer 420 to a light source 440. A masking structure 430 blocks light from curing photoresist 420 which allows the un-cured photoresist to be removed in a subsequent processing step. ARC layers 400 and 401 reduce standing waves in photoresist 420 as illustrated in FIGS. 4F and 4G.

Figure 4F:
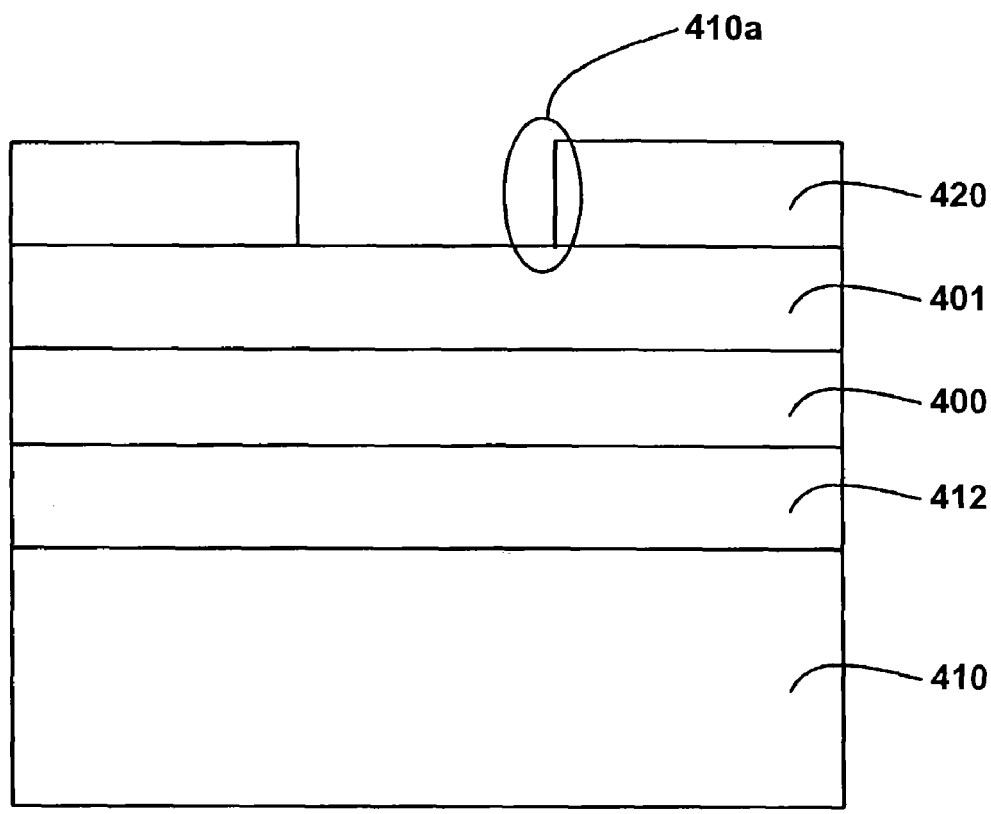

FIG. 4F illustrates the result of having multiple ARC layers with varying extinction coefficients, sidewall 410a of photoresist 420 is vertical and free from footing defects. Beneficially, substantial reduction of standing waves in photoresist 420 allows for accurate etching of oxide layer 412. In one embodiment of the invention, a positive photoresist is used and similar sidewalls 410a are achieved.

Figure 4G:
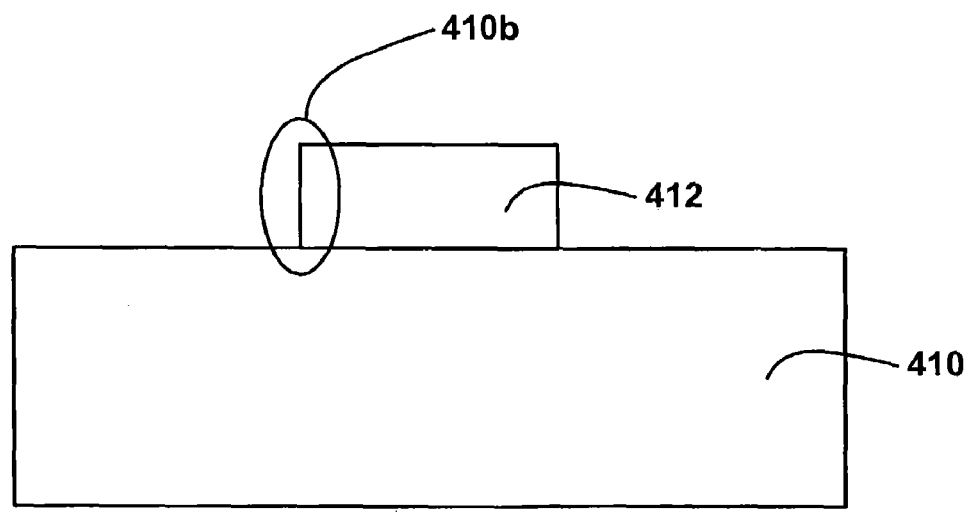
Figure 4H:
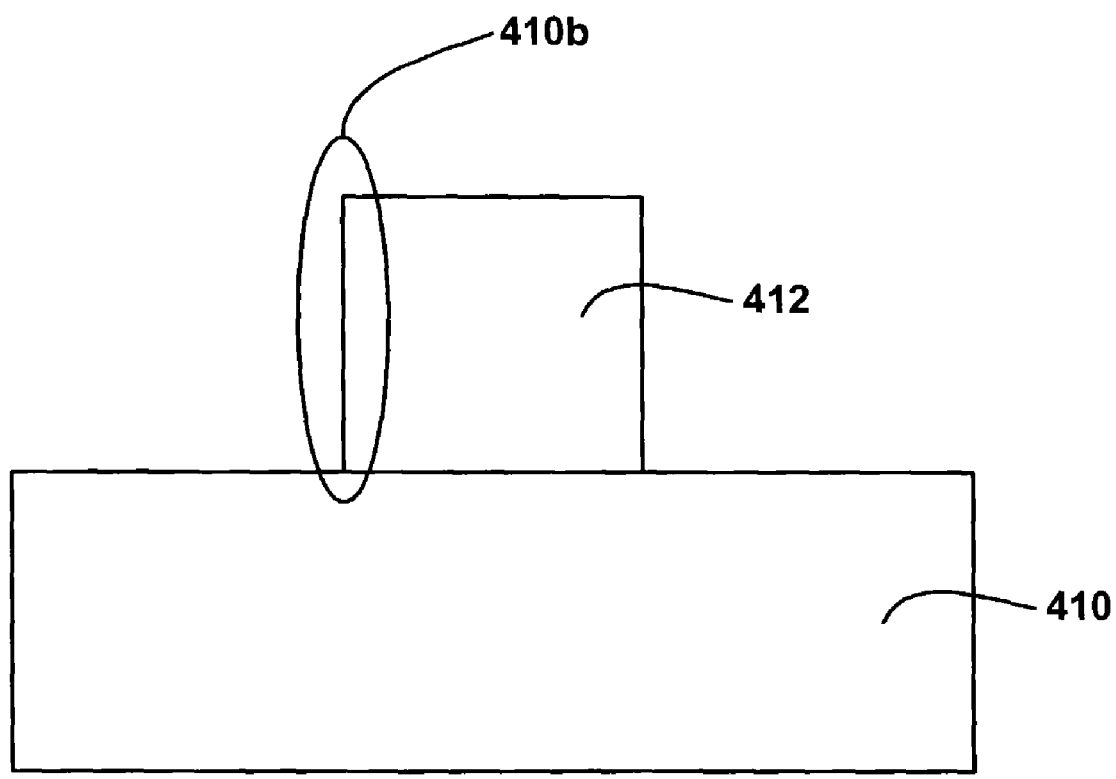

As illustrated in FIG. 4G, sidewall 410b of oxide layer 412 is substantially vertical and free from the ill effects of standing waves in the photoresist 420. A direct correlation between the contour of the sidewall of the photoresist and the resulting contour of the sidewalls of the oxide layer is observed. As a result of producing vertical sidewalls in the photoresist, an accurate oxide feature can be formed FIG. 4H is a close-up illustration showing the sidewall 410b of the semiconductor feature produced by using multiple ARC layers having varying extinction coefficients. The sidewalls 410b of the oxide layer are vertical and void of defects caused by standing waves in the photoresist.

Figure 5A:
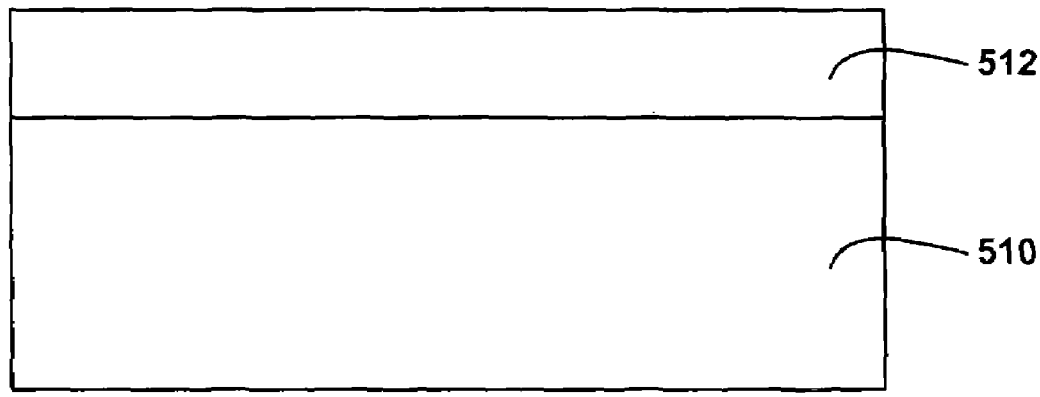
FIGS. 5A through 5F are illustrations of an exemplary semiconductor manufacturing process wherein an oxide layer is deposited above an antireflective coating to reduce footing in accordance with an embodiment of the present invention.
Figure 5B:
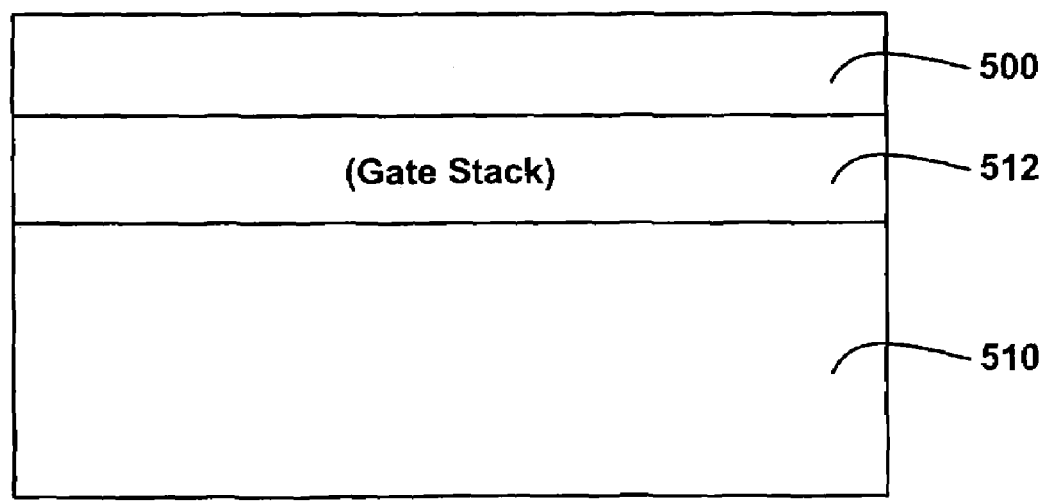
Figure 5C:
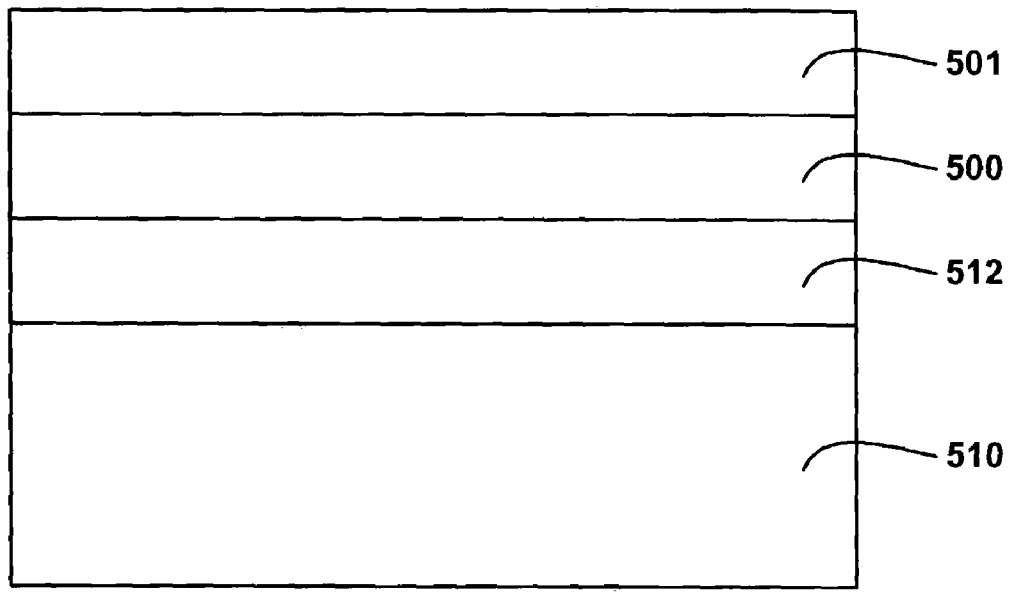
Figure 5D:
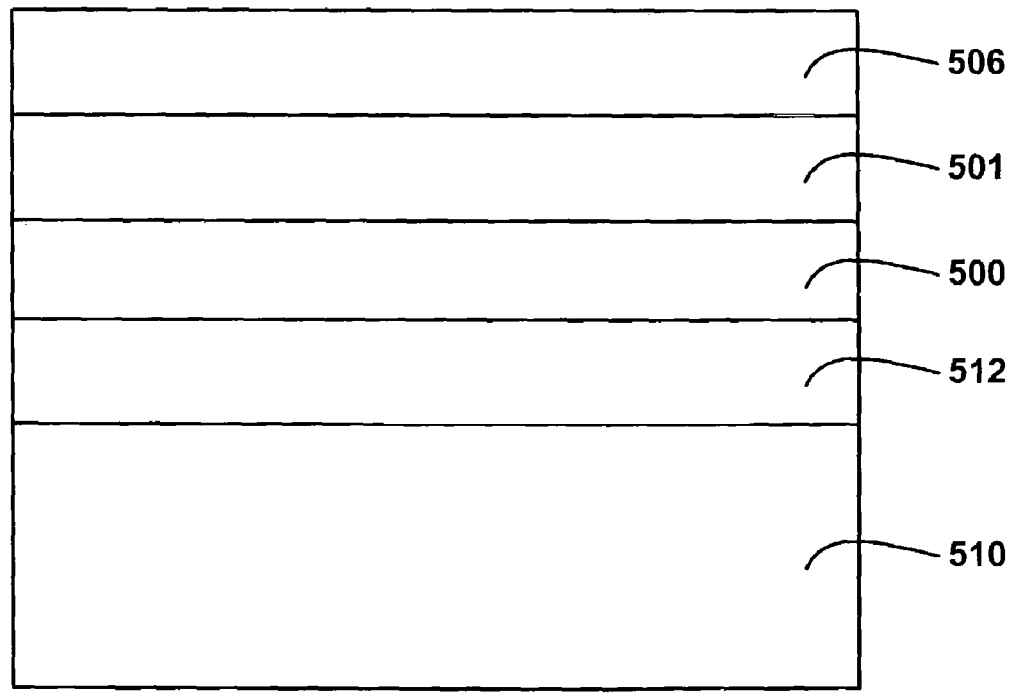
Figure 5E:
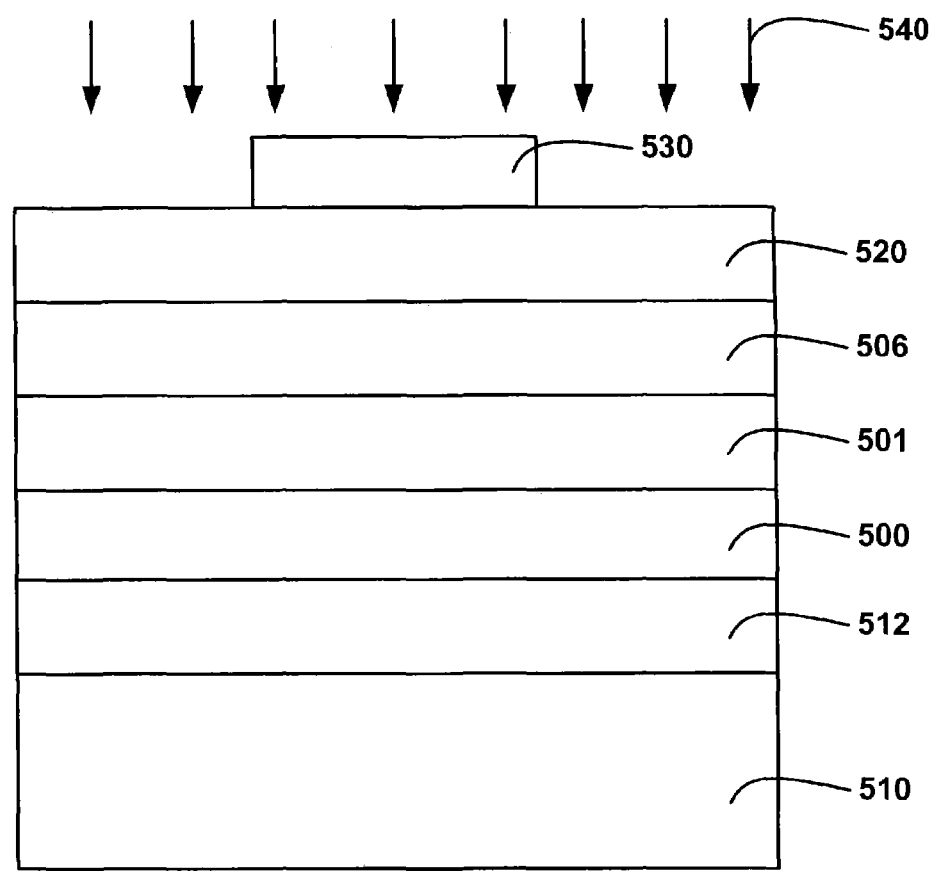
Figure 5F:
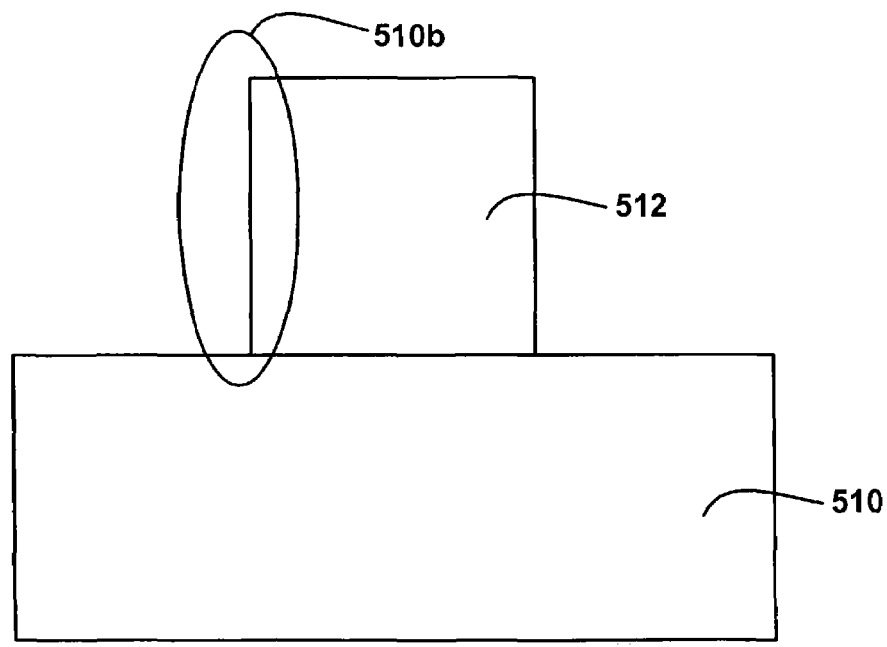
Figure 6B:
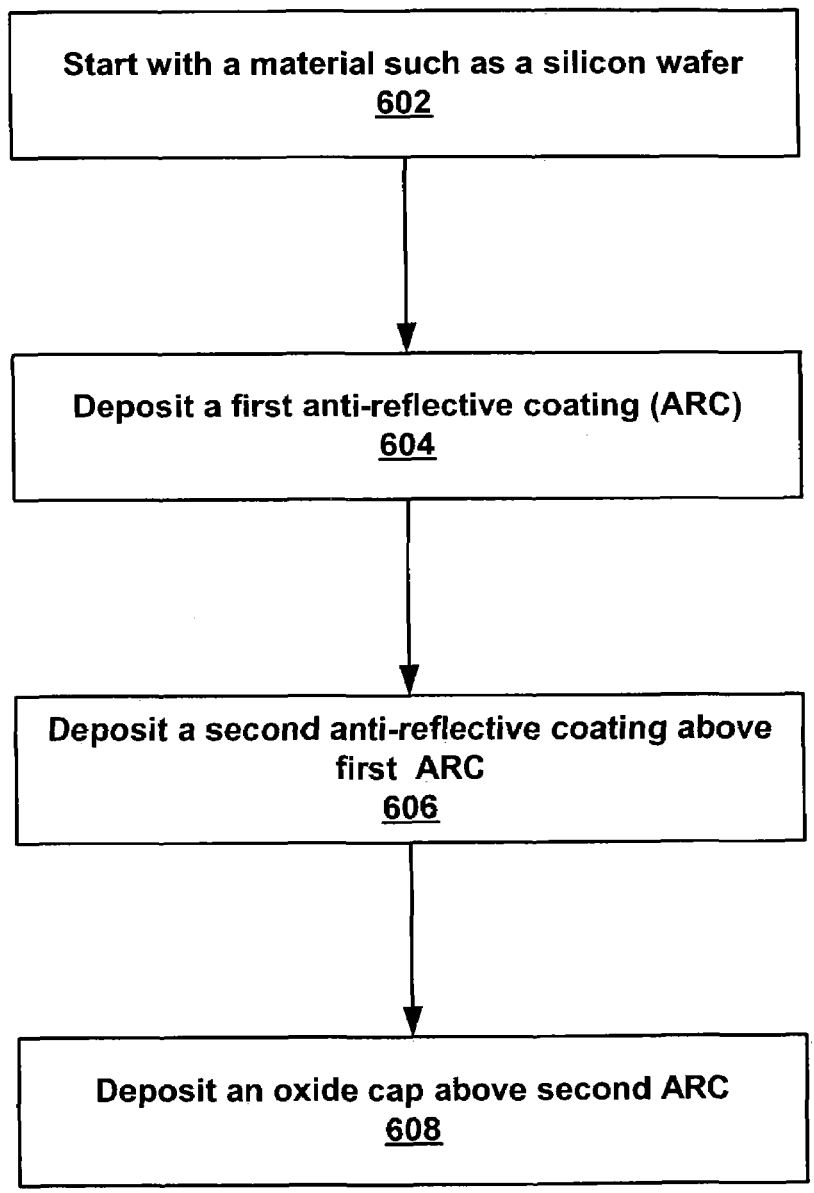

FIGS. 5A–5F provide side sectional views of the structure created according to embodiments of the method of the present invention as set forth in the flow chart of FIG. 6B. For purposes of clarity, the following discussion will utilize the side sectional views of FIGS. 5A–5F in conjunction with the flow chart 600b of FIG. 6B to clearly describe the embodiments of the present invention. Flow chart 600a of FIG. 6A begins with step 602. At step 602, the present embodiment forms a wafer or substrate such as, for example, a silicon substrate.

FIG. 5A is an illustration of an exemplary semiconductor manufacturing process to reduce standing waves in a photoresist wherein a multi-layered anti-reflective coating is used in accordance with an embodiment of the present invention. An oxide stack 512 is grown above wafer 510 by conventional means. Wafer 510 can be a silicon substrate or any other equivalent material suitable for the manufacturing of a semiconductor feature. Oxide stack (e.g., gate stack) 512 can be comprised of any combination of a tunnel oxide layer, an ONO stack or multiple polysilicon layers.

FIG. 5B illustrates the first layer of anti-reflective coating 500. Layer 500 is a conventional bottom anti-reflective coating, BARC. Layer 500 is typically inorganic, for example silicon oxynitride, and applied via chemical vapor deposition (CVD). Due to the deposition method, it is difficult to control both the optical characteristics and the thickness of layer 500. The variability of optical properties places great demands for precision in the layer thickness. Unfortunately, the thickness tolerance of layer 500, deposited by chemical vapor deposition processes, required to compensate for the optical variability of the material is typically not commercially feasible. In one embodiment of the present invention, ARC layer 500 is SiON, SiN, or SiC or any material that reduces reflections of light from wafer 510. Depositing ARC layer 500 corresponds to step 604 of FIG. 6B, a first antireflective coating is deposited above the starting material. In one embodiment of the present invention, a conductive oxide layer is deposited below the first anti-reflective coating.

An additional deleterious effect of conventional inorganic BARCs is known as "resist poisoning" or "footing." For some desirable conventional compositions of photoresist, residual nitrogen from the silicon oxynitride, for example BARC layer 500, contaminates the photoresist material. Such contamination may cause numerous ill effects, including, for example, blocking of light energy and/or difficulty in removing the contaminated resist material.

Layer 501 of FIG. 5C illustrates a novel second layer of anti-reflective material, according to an embodiment of the present invention. Typically, the ARC layers are deposited by chemical vapor deposition (CVD) or plasma enhanced chemical vapor deposition (PECVD). In one embodiment of the present invention, the second layer of ARC 501 has a lower extinction coefficient than the first layer of ARC 500. In another embodiment of the present invention, each ARC is plasma treated to null the effects of nitrogen poisoning, such as footing of the photoresist. Depositing the second ARC layer 501 corresponds to step 606 of FIG. 6B, to deposit a second ARC layer above the first ARC layer. In one embodiment of the present invention, the second ARC layer has a lower extinction coefficient than the first ARC layer.

FIG. 5D illustrates the addition of an oxide cap layer 506. Oxide cap layer 506 can be $SiO_2$ or any equivalent material. Oxide cap layer 506 further prevents footing to occur in the photoresist. The addition of oxide cap layer 506 corresponds to step 608 of FIG. 6B. In step 608 of FIG. 6B, an oxide cap is deposited above the second ARC layer. In one embodiment of the present invention, a photoresist is deposited above the oxide cap. The oxide cap aids in the prevention of footing due to nitrogen poisoning of the photoresist. In one embodiment of the present invention, the oxide cap is plasma treated to further enhance the prevention of footing in the photoresist.

FIG. 5E illustrates the addition of a photoresist layer 520 above the multiple ARCs. In one embodiment of the present invention, the thickness of each ARC layer is between 25 and 600 angstroms and the thickness of the oxide cap may be between 5 and 100 angstroms. Photoresist layer 520 can be a positive-type photoresist or a negative-type photoresist. For positive resists, the resist is exposed with UV light wherever the underlying material is to be removed. In these resists, exposure to the UV light changes the chemical structure of the resist so that it becomes more soluble in the developer. The exposed resist is then washed away by the developer solution, leaving windows of the bare underlying material. The mask, therefore, contains an exact copy of the pattern which is to remain on the wafer. Negative resists behave in just the opposite manner. Exposure to the UV light causes the negative resist to become polymerized, and more difficult to dissolve. Therefore, the negative resist remains on the surface wherever it is exposed, and the developer solution removes only the unexposed portions. Masks used for negative photoresists, therefore, contain the inverse (or photographic "negative") of the pattern to be transferred. FIGS. 5A through 5F show the pattern generated from the use of negative resist.

As a beneficial consequence of the novel combination of an additional anti-reflective coating having a lower extinction coefficient over a first anti-reflective coating having a higher extinction coefficient, reflections may be advantageously reduced or eliminated over a wide range of thickness for an underlying layer. In addition, having multiple layers of an ARC allows the final thickness of the ARC layer to be substantially less than an equivalent single ARC layer, thus reducing the work required to remove the ARC layer in subsequent processing steps. Furthermore, plasma treatment of the ARC stack advantageously eliminates nitrogen poisoning of a photoresist that might otherwise have occurred if the photoresist was applied directly over an anti-reflective coating.

FIG. 5E further illustrates the process of exposing a photoresist layer 520 to a light source 540. A masking structure 530 blocks light from curing photoresist 520 which allows the un-cured photoresist to be removed in a subsequent processing step. ARC layers 500 and 501 reduce standing waves in photoresist 520 as illustrated in FIG. 5F.

FIG. 5F illustrates the beneficial effects of using multiple ARC layers in conjunction with an oxide cap. Sidewall 510b of oxide layer 512 is substantially vertical and free from the ill effects of standing waves in the photoresist 520. A direct correlation between the contour of the sidewall of the photoresist and the resulting contour of the sidewalls of the oxide layer is observed. As a result of producing vertical sidewalls in the photoresist, an accurate oxide feature can be formed Advantageously, semiconductors manufactured using embodiments of the present invention may utilize smaller process feature sizes, resulting in denser arrays of semiconductor devices, resulting in lower costs for such devices and realizing a competitive advantage to practitioners of the improvements in the arts herein described.

Embodiments of the present invention, a structure and method for reducing standing waves in a photoresist have been described. While the present invention has been described in particular embodiments, it should be appreciated that the present invention should not be construed as limited by such embodiments, but rather construed according to the following claims.

The foregoing descriptions of specific embodiments of the present invention have been presented for purposes of illustration and description. They are not intended to be exhaustive or to limit the invention to the precise forms disclosed. The embodiments were chosen and described in order to best explain the principles of the invention and it's practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for reducing standing wave formation in a photoresist during manufacturing a semiconductor device comprising:
   depositing a first anti-reflective coating having an extinction coefficient above a material, wherein said first anti-reflective coating comprises silicon and nitrogen, and exposing said first anti-reflective coating to a plasma environment to null effects of nitrogen poisoning on said photoresist;
   depositing a second anti-reflective coating having an extinction coefficient above said first anti-reflective coating, and exposing said second anti-reflective coating to a plasma environment to null effects of nitrogen poisoning on said photoresist;
   subsequent to exposing said first and second anti-reflective coatings to said plasma environments, depositing an oxide film comprising $SiO_2$ above said first and second anti-reflective coatings to prevent footing in said photoresist, such that said first anti-reflective coating, said second anti-reflective coating, and said oxide film reduce the formation of standing waves in a photoresist during a lithography process;
   exposing said oxide film to a plasma environment to further enhance said prevention of footing; and
   subsequent to exposing said oxide film to a plasma environment, forming said photoresist above said oxide film.

2. The method as described in claim 1 wherein said first anti-reflective coating has a thickness less than 600 angstroms.

3. The method as described in claim 1 wherein said second anti-reflective coating has a thickness no greater than 600 angstroms.

4. The method as described in claim 1 wherein said first anti-reflective coating has an extinction coefficient greater than said second anti-reflective coating.

5. The method as described in claim 1 wherein said second anti-reflective coating has an extinction coefficient greater than said first anti-reflective coating.

6. The method as described in claim 1 further comprising depositing a third anti-reflective coating above said second anti-reflective coating wherein said third anti-reflective coating has a thickness no greater than 600 angstroms.

7. A method for reducing standing waves in a photosensitive material during manufacturing of a semiconductor device comprising:
   depositing a first anti-reflective coating having an extinction coefficient on a material, wherein said first anti-reflective coating comprises silicon and nitrogen;
   exposing said first anti-reflective coating to a plasma environment to null effects of nitrogen poisoning in said photosensitive material;
   depositing a second anti-reflective coating having an extinction coefficient above said first anti-reflective coating;
   exposing said second anti-reflective coating to a plasma environment to null effects of nitrogen poisoning in said photosensitive material;
   depositing an oxide layer comprising $SiO_2$ above said second anti-reflective coating, such that said first anti-reflective coating and said second anti-reflective coating reduce the formation of standing waves in a photosensitive material during a lithography process and said oxide layer reduces an occurrence of footing; and
   exposing said oxide layers to a plasma environment to further enhance prevention of footing.

8. The method as described in claim 7 wherein said first anti-reflective coating has a thickness of less than 600 angstroms.

9. The method as described in claim 7 wherein said second anti-reflective coating has a thickness no greater than 600 angstroms.

10. The method as described in claim 7 further comprising:
    depositing a third anti-reflective coating above said second anti-reflective coating wherein said third anti-reflective coating has a thickness no greater than 600 angstroms; and
    exposing said third anti-reflective coating to plasma environment to null effects of nitrogen poisoning on said photosensitive material.

11. The method as described in claim 7 wherein said oxide layer comprises a plurality of layers.

12. The method as described in claim 7 wherein said first anti-reflective coating has an extinction coefficient greater than said second anti-reflective coating.

13. The method as described in claim 7 wherein said second anti-reflective coating has an extinction coefficient greater than said first anti-reflective coating.

14. A structure for reducing the formation of standing waves during manufacture of a semiconductor comprising:
   a first plasma treated anti-reflective coating comprising silicon and nitrogen and having an extinction coefficient deposited on a material;
   a second plasma treated anti-reflective coating having an extinction coefficient deposited above said first anti-reflective coating; and
   a plasma treated oxide film comprising $SiO_2$ deposited above said second anti-reflective coating, such that said first anti-reflective coating, said second anti-reflective coating, and said oxide film reduce the formation of standing waves in a photosensitive material during a lithography process.

15. The structure as described in claim 14 wherein said first anti-reflective coating has an extinction coefficient greater than said second anti-reflective coating.

16. The structure as described in claim 14 wherein said second anti-reflective coating has an extinction coefficient greater than said first anti-reflective coating.

17. The structure as described in claim 14 further comprising:
   depositing a third anti-reflective coating above said second anti-reflective coating wherein said third anti-reflective coating has a thickness no greater than 600 angstroms.

18. The structure as described in claim 14 wherein said anti-reflective coatings are deposited by low-pressure chemical vapor deposition.

* * * * *